United States Patent [19]
Burns

[11] Patent Number: 5,804,870
[45] Date of Patent: *Sep. 8, 1998

[54] HERMETICALLY SEALED INTEGRATED CIRCUIT LEAD-ON PACKAGE CONFIGURATION

[75] Inventor: Carmen D. Burns, Austin, Tex.

[73] Assignee: Staktek Corporation, Austin, Tex.

[ * ] Notice: The term of this patent shall not extend beyond the expiration date of Pat. No. 5,572,065.

[21] Appl. No.: 380,541

[22] Filed: Jan. 30, 1995

Related U.S. Application Data

[63] Continuation-in-part of Ser. No. 905,587, Jun. 26, 1992, abandoned.

[51] Int. Cl.⁶ .................................................. H01L 23/495
[52] U.S. Cl. ......................... 257/666; 257/675; 257/700; 257/704; 257/725
[58] Field of Search ..................................... 257/666, 675, 257/700, 704, 725

[56] References Cited

U.S. PATENT DOCUMENTS 5,572,065  11/1996  Burns ....................................... 257/666

*Primary Examiner*—Sara W. Crane
*Assistant Examiner*—Roy Potter
*Attorney, Agent, or Firm*—Fulbright & Jaworski L.L.P.

[57] ABSTRACT

A hermetically sealed ceramic integrated circuit package and method for achieving same, the package including an internal lead frame attached to an integrated circuit die in a lead-on-chip configuration, an external lead frame attached to the package exterior in a lead-on-package configuration and a high temperature adhesive layer which attaches the internal lead frame to the integrated circuit die.

11 Claims, 16 Drawing Sheets

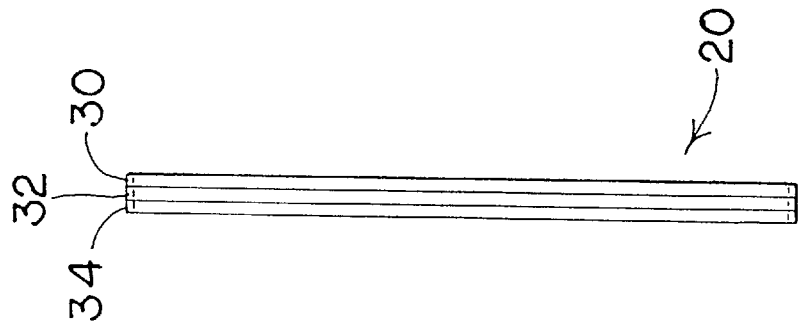
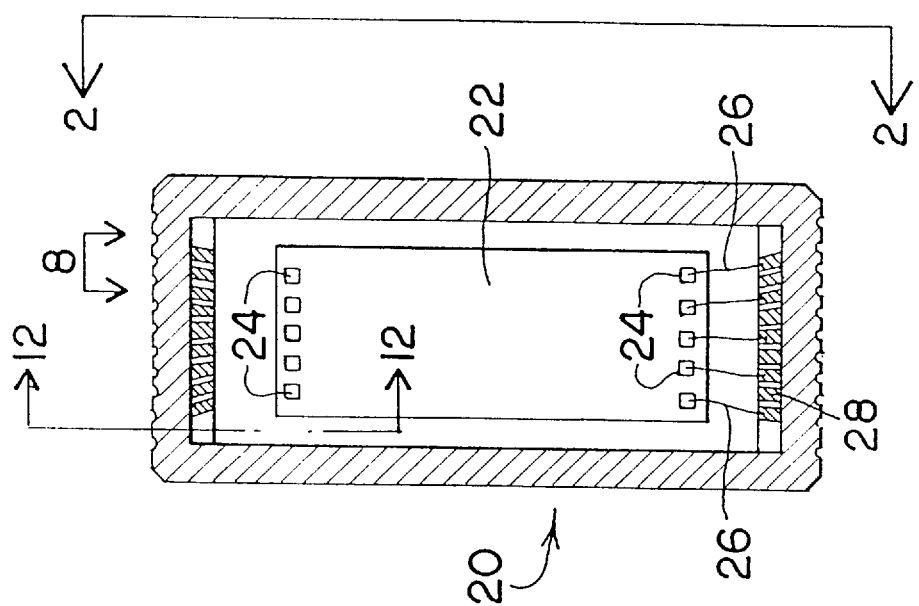

HERMETICALLY SEALED INTEGRATED CIRCUIT LEAD-ON PACKAGE CONFIGURATION

This application is a continuation-in-part of patent application Ser. No. 07/905,587, filed Jun. 26, 1992, now abandoned.

BACKGROUND OF THE INVENTION

1. Field of the Invention

This invention relates to a method and apparatus for fabricating hermetically sealed ceramic integrated circuit packages. In particular, the invention relates to a hermetically sealed ceramic integrated circuit package having an external lead frame attached to the package exterior and electrically connected to the integrated circuit within the package.

2. Discussion of the Related Technology

Ceramic material is normally used in packaging the integrated circuits to military specifications because of its reliability, heat dissipation characteristics, resistance to vapor and gas penetration, and electrical insulation properties. Fabrication of integrated circuit ceramic packages are well known in the art and have been used extensively in all critical aerospace and military applications.

present hermetically sealed ceramic packages do not contain an internal lead frame adhered to the integrated circuit within the package and an external lead frame on the exterior of the package electrically connected to the integrated circuit within the package.

prior art hermetically sealed ceramic integrated circuit packages are large and bulky, resulting in inefficient packaging that is incapable of miniaturization and inappropriate for stacking sufficient for today's sophisticated electronic technology. As military weapon systems, such as smart bombs and advanced tactical electronic warfare systems are used in smaller and faster missiles and aircraft, respectively, the need for higher packaging density becomes more critical. Likewise, in space satellite technology, size, weight and reliability factors are of particular concern.

packaging techniques for integrated circuit technology are being developed in an attempt to satisfy demands for miniaturization in the semiconductor industry. Improved methods for miniaturization of integrated circuits enabling the integration of millions of transistor circuit elements into single integrated silicon embodied circuits, or dies, have resulted in increased emphasis on methods to package these integrated circuit dies in space efficient, yet reliable and mass producible packages.

An integrated circuit die is comprised of many interconnected transistors and associated passive circuit elements that perform a function or functions. These functions may include computing, memory data storage, communications, weapons and fire control, etc. Different types of integrated circuit dies are used to create electronic systems to perform specific functions. Combining the functions of different integrated circuit dies requires electrically connecting each integrated circuit into the circuits of the system. In order to accomplish this interconnection, conductive paths must be made available to connect the internal circuitry of an integrated circuit die to another integrated circuit die in a stack, or to external electrical circuits of the system.

Military specification hermetically sealed ceramic integrated circuit packages may sandwich an integrated circuit die and interconnection means between a ceramic or metal element. Various methods of hermetically sealing the ceramic integrated circuit packages are well known in the integrated circuit industry. Either leaded or smaller leadless hermetically sealed package integrated circuit packages make the integrated circuit die electrical connections through the ceramic material and on to the outer surface of the integrated circuit ceramic package. System electrical connections are made to these external ceramic package connections.

SUMMARY OF THE INVENTION

In contrast to such prior technology, the packaging method and apparatus of the present invention attaches an integrated circuit die to a hermetically sealable ceramic housing in such a way as to enhance thermal conduction of heat from the die and to allow two or more ceramic integrated circuit packages to be stacked, one on another. This ceramic housing is also in communication with an internal metal lead frame that further enhances the thermal transfer of heat from the ceramic material and integrated circuit die. Heat transfer is improved by reducing the thickness of the materials between the die and the heat conductive internal lead frame. The external lead frame mounted to the ceramic package exterior surface also facilitates heat transfer away from the ceramic package. In addition, the present invention reduces the integrated circuit die thickness further improving heat transfer and permitting a thinner overall package which can be stacked.

The present invention also provides a method and apparatus for attaching an internal lead frame to a major surface of an integrated circuit die within the ceramic housing and laminating a external lead frame to the ceramic housing exterior. The present invention comprises an integrated circuit package that meets military and aerospace specifications with improved thermal transfer characteristics. The improved thermal transfer characteristics result in better heat dissipation from the integrated circuit die with a commensurate improvement in overall system reliability.

In order to achieve the thinnest package possible all fabrication layers needed to construct a useful integrated circuit package must be minimized in thickness and number. The present invention provides an ultra-thin package which results from reducing the number of layers and the thickness of each layer to a minimum during fabrication of the package elements. The present invention provides a novel manufacturing process for assembling hermetically sealed ceramic integrated circuit packages in a cost effective and simple to use assembly process. The present invention provides a packaging arrangement that facilitates the use of standard size ceramic packages for different size and function integrated circuit dies by means of lead-on-chip lead frames adapted for each type and size of die. These lead-on-chip lead frames may be supported or unsupported and have the bond pads in the center of the die or on the edges of the die, as more fully illustrated in co-pending U.S. patent application Ser. No. 07/746,268 by Carmen D. Burns, filed Aug. 15, 1991, entitled "Lead-On-Chip Integrated Circuit Fabrication Method and Apparatus," and incorporated herein by reference for all purposes.

The package density and performance of electronic circuits may be improved by stacking the integrated circuit packages closely together such as, for example, in a three dimensional array. Various embodiments of three dimensional integrated circuit array stacks are more fully illustrated in co-pending U.S. patent applications Ser. Nos. 07/561,417 and 08/186,827 by Carmen D. Burns, filed Aug.

1, 1990 and Jan. 24, 1994, respectively; entitled "Ultra High Density Integrated Circuit packages Method and Apparatus," and incorporated herein by reference for all purposes. More integrated circuit packages may be stacked in a given space if the integrated circuit packages used are ultra-thin. However, whenever the number of active circuit elements in a package is increased, there is a corresponding increase in heat generation and heat dissipation becomes critical. The present invention improves both packaging density and heat dissipation characteristics, resulting in a small package with higher circuit density and improved power dissipation characteristics.

The preferred embodiment of the present invention uses a ceramic housing manufactured by Coors Electronics package Company. This ceramic housing is comprised of three thin layers: (1) a ceramic base; (2) metal on ceramic wire bond pads; and (3) metal on ceramic seal ring. These three layers are fused together to form a hermetically sealable ceramic housing. The integrated circuit die is lapped to a thickness of approximately 5.5 mils. The lapped integrated circuit is mounted within the ceramic housing by firing silver-loaded glass placed between the bottom surface of the die and the base layer of the ceramic housing.

The integrated circuit die has connection pads that are aluminum wedge bonded to the wire bond pads of the ceramic housing. The ceramic housing wire bond pads are brought out to the external surface of the housing at castellations placed along the edges of the ceramic housing. After the die is mounted within the ceramic housing and the aluminum wire bond connections are made, this partially fabricated integrated circuit may be placed in a nitrogen filled oven where the ceramic housing and, for example, a kovar lid are hermetically sealed together.

Hermetic sealing takes place when preformed solder fillets on both the kovar lid and the ceramic housing seal ring layer reflow together. After the reflow soldered lid and housing seal ring cool, the hermetically sealed integrated circuit package may be removed from the oven. Inert nitrogen gas remains within the hermetically sealed inner cavity formed by the ceramic housing and lid. Alternative means of hermetically sealing the ceramic housing are seam or laser welding of a metal lid, or using a ceramic lid with a glass seal.

The ceramic housing may be, for example, 22 mils thick, wherein the base layer may be 8 mils, the wire bond pad layer 7 mils, and the seal ring layer 7 mils. The integrated circuit die is lapped to a thickness of approximately 5 mils which improves its thermal conductivity in addition to minimizing package thickness requirements. The silver-loaded glass used to mount the die to the ceramic base layer may be 2 mils thick. The inside cavity of the ceramic housing may be 14 mils deep, leaving at least 8 mils clearance for aluminum wire bond connections to the integrated circuit die connection pads. The kovar lid may add an additional 7 to 10 mils to the hermetically sealed ceramic package thickness. The solder seal used to seal the kovar lid to the ceramic housing may be 2 mils thick, for example, gold/tin (80/20) preform. The package of the present invention greatly improves the heat dissipation because of the low thermal resistance of the ultra thin die and base layer. These ultra thin elements of the present invention allow faster and more efficient heat transfer from the integrated circuit die to the lead frame and ultimately into the heat dissipation means.

The integrated circuit die may be tested after it is hermetically sealed within the ceramic housing, as described above. At least two types of testing may be performed at this stage of packaging. The integrity of the hermetic seal may be tested for leakage in accordance with Military Standard 883, method 1014-5. If an integrated circuit package fails a test, the method and apparatus of the present invention lends itself to easy rework and/or inspection of the rejected packages. After mechanically testing the hermetic seal of the ceramic integrated circuit package, an external lead frame having a plurality of electrical conductors is laminated or braised to an exterior major surface of the ceramic housing base layer, i.e., the bottom surface of the integrated circuit ceramic package. The external lead frame is formed so that selected electrical lead frame conductors attach to selected electrically conductive contacts formed on the bottom surface of the ceramic housing. The contacts are electrically connected to the integrated circuit die by vias which pass through the ceramic package and are electrically connected to appropriate circuit interconnects formed in the integrated circuit.

In the preferred embodiment, the external lead frame is mounted to the bottom of the ceramic integrated circuit package with a thin adhesive that may be, for example, only 0.3 mils thick, or by braising to selected portions to the package exterior. Close proximity of the metal external lead frame to the bottom face of the ceramic housing greatly improves the thermal conductance of the overall ceramic package. Ceramic is an average heat conductor, whereas metal is an excellent conductor.

The present invention utilizes the high thermal conductance of the internal metal lead frame to effectively absorb and transfer the heat flow from the integrated circuit die through the thin ceramic base layer. The metal lead frame surface area is maximized to obtain the most efficient heat flow. Ultimately, the heat flowing through the lead frame dissipates into the electronic system connection interface, for example, a multi-layer printed circuit board.

In addition to adequate heat dissipation for the integrated circuit die, the integrated circuit package must also provide protection for the integrated circuit from alpha particle bombardment and photon emissions from light sources. Both alpha particles and photons may cause hard and soft data errors in digital electronic systems. Polymeric film may be used as an alpha barrier as suggested in U.S. Pat. No. 4,426,657, by Abiru, et al. High temperature polymer coatings such as, for example, polyimide may be placed over the face of the integrated circuit and the polyimide will effectively act as a barrier to the alpha particles.

The polymer used may be, for example, high temperature, low moisture polyimide of the additive reaction type wherein no water is generated in its formation. Polymers of the additive reaction type are preferred over polymers of the condensation reaction type because of the requirement of minimizing the moisture content of the integrated circuit package. By judicious use of high temperature low moisture polymers, the present invention may easily meet the demanding specifications required of ceramic packaging.

A kovar lid insulated with a polymer coating will prevent electrical shorting of the conductive lead frame and leads when multiple integrated circuit packages are stacked one on top of another. This polymer coating may be, for example, 0.5 mil thick high temperature polymer such as a polyimide film layer which will prevent the lead frame of the upper package from shorting to the metal lid of the lower package. This allows for extremely tight and compact packing densities in a level II package as more fully described in co-pending U.S. patent application Ser. No. 07/561,417, by Carmen D. Burns. In addition, this film layer may be used as a solder mask to prevent solder from coming into contact with the solder seal filet of the ceramic package lid.

The method and apparatus of the present invention results in a reliable, heat dissipating, cost efficient and easily manufactured hermetically sealed ceramic integrated circuit package useful for both military and aerospace applications.

A lead-on-chip integrated circuit die assembly may be adapted for connection within a standard housing of the present invention. A detailed description of the method and apparatus of preferred embodiments of lead-on chip technology are more fully described in co-pending patent applications Ser. No. 07/746,268, filed Aug. 15, 1991, and Ser. No. 07/783,737, filed Oct. 28, 1991, both by Burns and incorporated herein by reference for all purposes.

Both supported and unsupported lead-on-chip and lead-on-package lead frames may be adapted for attachment and connection to a specific integrated circuit die and integrated circuit package exterior, respectively. The lead-on-chip lead frame may be designed so as to connect within the standard ceramic housing independent of die size or pad connection configurations. Thus, by fabricating a specific lead frame adapted for attachment and connection to a specific die, the ceramic housings of the present invention may be designed without regard to any specific die or pad layout thereon. In addition, prior art ceramic housings may be utilized with various dies using lead-on-chip lead frames adapted for connecting the prior art housing connections to the die bond pads. The lead-on-package configuration may also use a customized lead frame to selectively connect connection pads on an integrated circuit die with external electronic devices.

The present invention may use metal ground planes for improved noise reduction and heat transfer dissipation. A metal ground plane may be utilized between the face of the die and the lead frame and/or between the bottom of the ceramic housing and the housing lead frame. A unique aspect of the present invention is a heat spreading metal ground plane either between the face of the IC die and the lead frame, above the lead frame or both using two ground planes sandwiching the lead frame therebetween. By electrically connecting the metal ground plane to appropriate electrical connections within the electronic system, electrical noise may also be greatly reduced.

Use of ground planes to reduce IC circuit noise and/or to control signal impedances allows improvements in the operating speeds of ICs such as static random access memory (SRAM) and dynamic random access memory (DRAM). The ground plane of the present invention may be used to spread heat flow, it may also be used to reduce noise, or it may additionally be used in conjunction with the lead frame conductors for constant impedance signal transmission lines. The ground plane may extend from the integrated circuit for connection to a heat dissipation system, noise grounding system and/or constant impedance signal transmission system integral with the ceramic housing.

An object of the present invention is a method of manufacturing a hermetically sealed ceramic integrated circuit package having good thermal conductivity for efficiently transferring heat from an integrated circuit contained therein by mounting the integrated circuit into a ceramic housing comprising a base, wire bond pads and seal ring, and connecting the integrated circuit electrical circuits to external connection pads, attaching a cover to the ceramic housing, hermetically sealing the integrated circuit within, laminating a lead frame to the ceramic housing base and using this lead frame for both electrical connections and heat transfer from the integrated circuit.

Yet another object of the present invention is to provide a hermetically sealed ceramic integrated circuit package having good thermal conductivity for efficiently transferring heat from an integrated circuit where the die is attached to a ceramic housing and electrical connections are made from the die to external connections on the housing, the integrated circuit die is hermetically sealed within the ceramic housing and a lead frame is laminated to the bottom of the ceramic housing for electrical connections and heat transfer.

A further object of the present invention is to provide a package which utilizes an integrated circuit die that is 5 mils thick.

Still a further object of the present invention is to provide a package which utilizes a thin ceramic housing comprised of three thin layers, a ceramic base, metal on ceramic wire bond pad and metal on ceramic seal ring layers fused together to form a hermetically sealable ceramic housing.

Yet a further object of the present invention is to provide a ceramic housing comprised of a ceramic base, metal on ceramic wire bond pad, and metal on ceramic seal ring layers, being 8 mils, 7 mils, and 7 mils thick, respectively.

A further object of the present invention is to mount the integrated circuit die to the ceramic housing by firing silver-loaded glass therebetween.

Still a further object of the present invention is to mount the integrated circuit die to the ceramic housing by laminating a thermally filled polymer therebetween.

A further object of the present invention is to connect the integrated circuit connection pads to the housing wire bond pads by means of aluminum wedge bonding.

Another object of the present invention is to make connections between the hermetic package castellations and lead frame by means of thermal compression bonding.

An object of the present invention is to make connections to the integrated circuit package external electrical connection contacts with an external lead frame electrically connected to the contacts.

Still a further object of the present invention is making thermal compression bonding connections by means of ultra-sonic compression.

Yet a further object of the present invention is to hermetically seal the ceramic package with a metal cover made of kovar.

An object of the present invention is to provide a package including a thin layer of polymer over the face of the integrated circuit die for shielding from alpha particles.

A further object of the present invention is to laminate a lead frame to the ceramic housing with at least 0.3 mil thick adhesive.

Still a further object of the present invention is to connect the wire bond pad castellations on the exterior surface of the ceramic housing to the lead frame electrical conductors by means of soldering.

Another object of the present invention is to hermetically seal the ceramic housing and lid by means of solder preform rings on the housing seal ring layer and interface of the lid, respectively.

Yet another object of the present invention is to hermetically seal the ceramic housing and lid by means of seam or laser welding.

A further object of the present invention is to hermetically seal a ceramic housing to a ceramic lid by means of a glass seal.

Still a further object of the present invention is using a thin high temperature polymer layer over the lid for both electrical insulation of the lead frame and prevention of light entering the ceramic housing cavity.

A further object of the present invention is using a thin high temperature polymer layer over the solder seal to prevent contact of the hermetic seal when soldering together stacked ceramic packages by means of, for example, dipping into a solder fountain.

An object of the present invention is to provide a package wherein a standard ceramic housing may be used in conjunction with various lead-on-chip lead frame configurations to accommodate various sizes and forms of integrated circuit dies.

A further object of the present invention is to provide a package wherein a standard size ceramic housing may be used in conjunction with various lead frame configurations to accommodate various sizes and forms of multiple integrated circuit dies.

An object of the present invention is the use of a ground plane with a lead frame for noise reduction in a ceramic housing that may be adapted for good thermal conduction and low impedance electrical connection of the ground plane.

Other and further objects, features and advantages will be apparent from the following description of the presently preferred embodiment of the invention, given for the purpose of disclosure and taken in conjunction with the accompanying drawings.

BRIEF DESCRIPTION OF THE DRAWINGS

FIG. 1 illustrates a ceramic integrated circuit package of the present invent n in schematic top view and having the top cover removed so that the integrated circuit die contained therein is exposed;

FIG 2 is a side view of FIG. 1;

DETAILED DESCRIPTION OF THE PREFERRED EMBODIMENT

Figure 5:
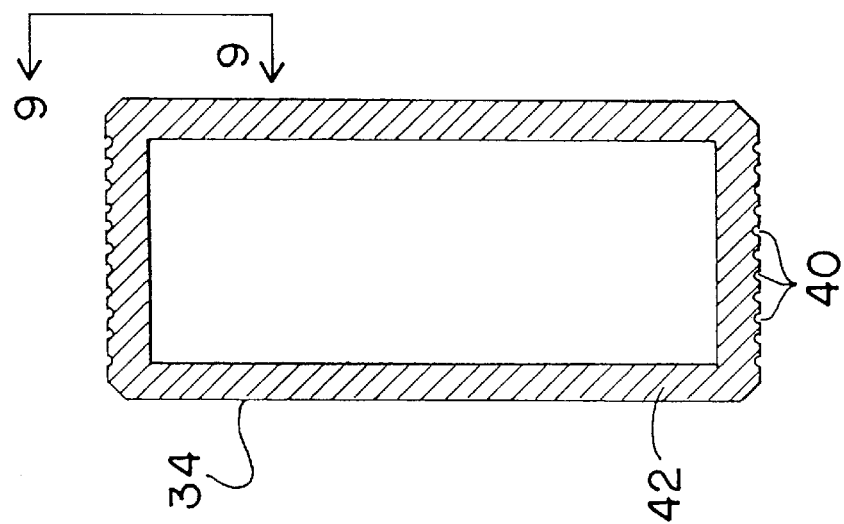
FIG. 3–5 illustrate in schematic top views the base, wire bond pad and seal ring layers, respectively, which comprise the ceramic integrated circuit package assembly illustrated in FIG. 1.
Figure 4:
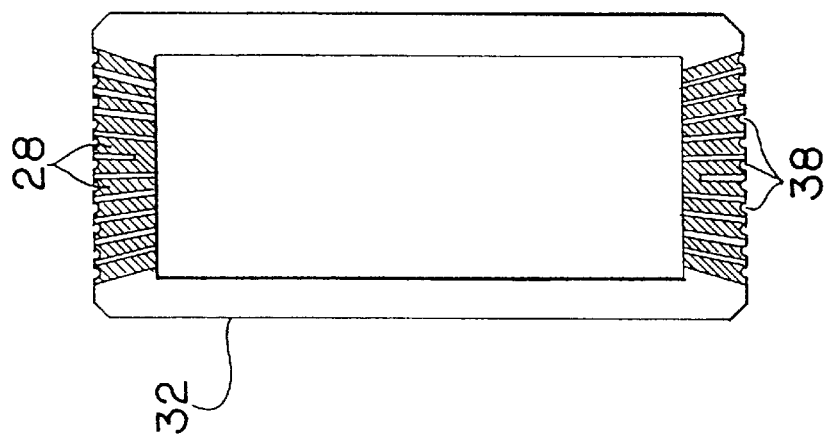
Figure 3:
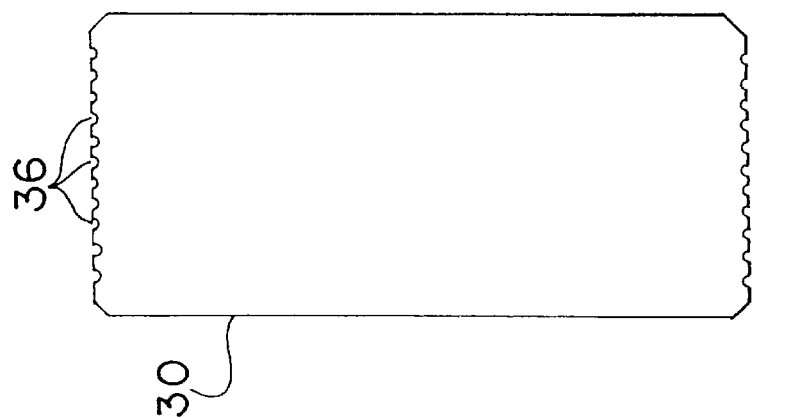

A better understanding of the present invention will be obtained when the following detailed description is read with reference to the drawings wherein common elements are designated with like numbers or letters and similar elements are designated with like numbers followed by a lower case letter. Referring now to FIG. 1, a ceramic integrated circuit package having the top cover removed, so the integrated circuit die contained therein is exposed, is illustrated in schematic top view. An integrated circuit ceramic housing assembly 20 surrounds an integrated circuit die 22. In FIG. 2 a side view of the ceramic housing 20 is illustrated.

Referring now to FIGS. 1–5, the ceramic housing 20 is comprised of three layers of ceramic and metal on ceramic. A ceramic base layer 30 (FIG. 3) makes up the bottom face of the ceramic package 20 and is used also for the attachment of the integrated circuit die 22 (FIG. 1). A ceramic wire bond pad layer, or electrical connection portion 32 (FIG. 4) is used for making electrical connections through the ceramic housing 20. Ceramic seal ring layer 34 (FIG. 5) is used to attach lid 44 (FIG. 16) when forming a hermetically sealed package. Housing 20 may be purchased from Coors Electronics Package Company as a prefabricated subassembly having base 30, bond pad layer 32, and insulated ceramic seal ring layer 34 which may be fused together.

Figure 6:
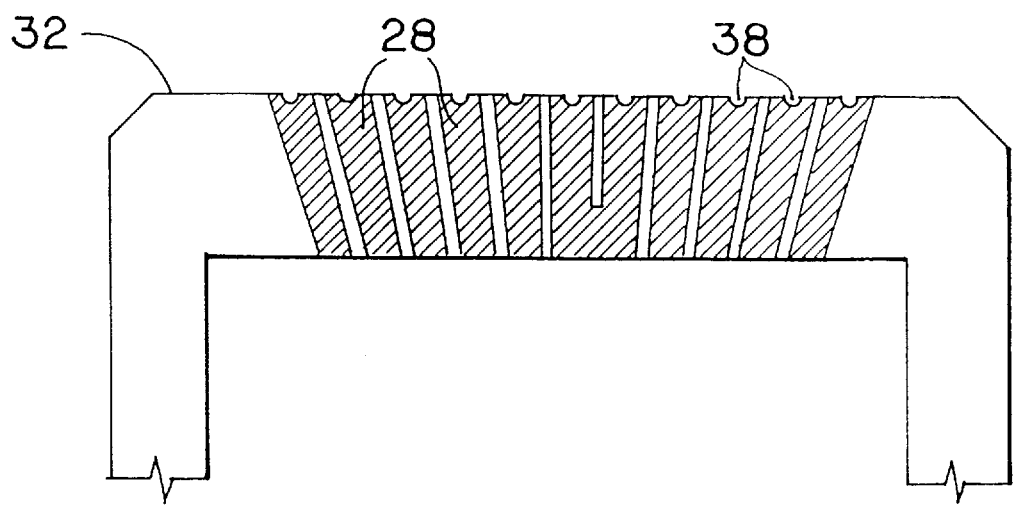
FIG 6 illustrates in schematic top view an enlarged partial view of the wire bond pad layer of FIG. 4.

Electrical connections from die connection pads 24 are made to ceramic housing wire bond pads 28 by means of bond wires 26, where the bond wires are preferably aluminum. Aluminum wire bonding of integrated circuit die 22 connection pads 24 to external package connections (wire bond pads 28) is well known to those in the art of fabricating integrated circuit packages. Housing wire bond pads 28 are more clearly illustrated in FIG. 6.

Referring now to FIGS. 3–7, base 30 has small indentations or castellations 36 that are metal plated 37 for connection to external circuit conductor means. Bond pad layer 32 has metal plated housing wire bond pads 28 connected to castellations 38. The ceramic seal ring layer 34 has a preformed metalized seal ring 42, for example, gold plated and solder tinned, for attaching to lid 44 (FIG. 12) when hermetically sealing housing 20. Ceramic seal ring layer 34 also has non-metalized castellations 40.

Figure 7:
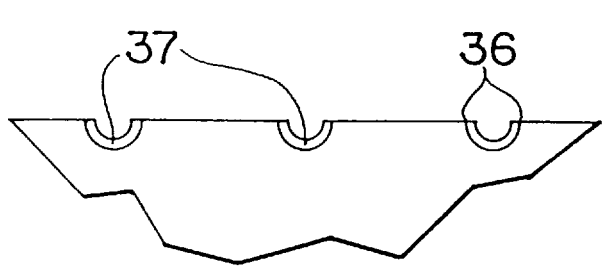
FIG. 7 illustrates in schematic top view an enlarged partial view of the base layer of FIG. 3.
Figure 8:
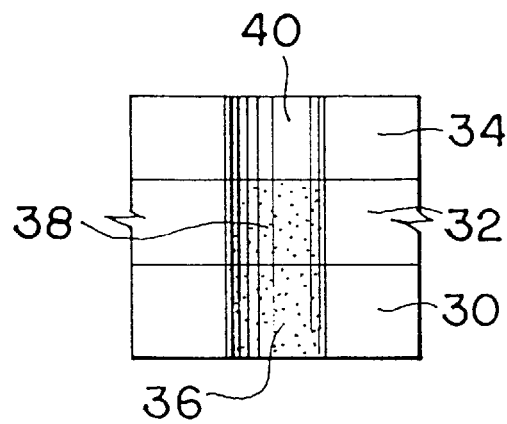
FIG. 8 illustrates section 8—8 of FIG. 1 in schematic elevational view.
Figure 9:
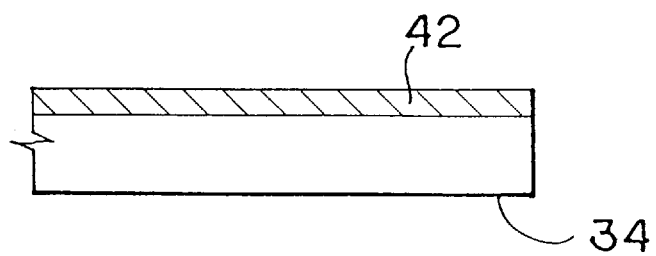
FIG. 9 illustrates section 9—9 of FIG. 5 in schematic elevational view.
Figure 14:
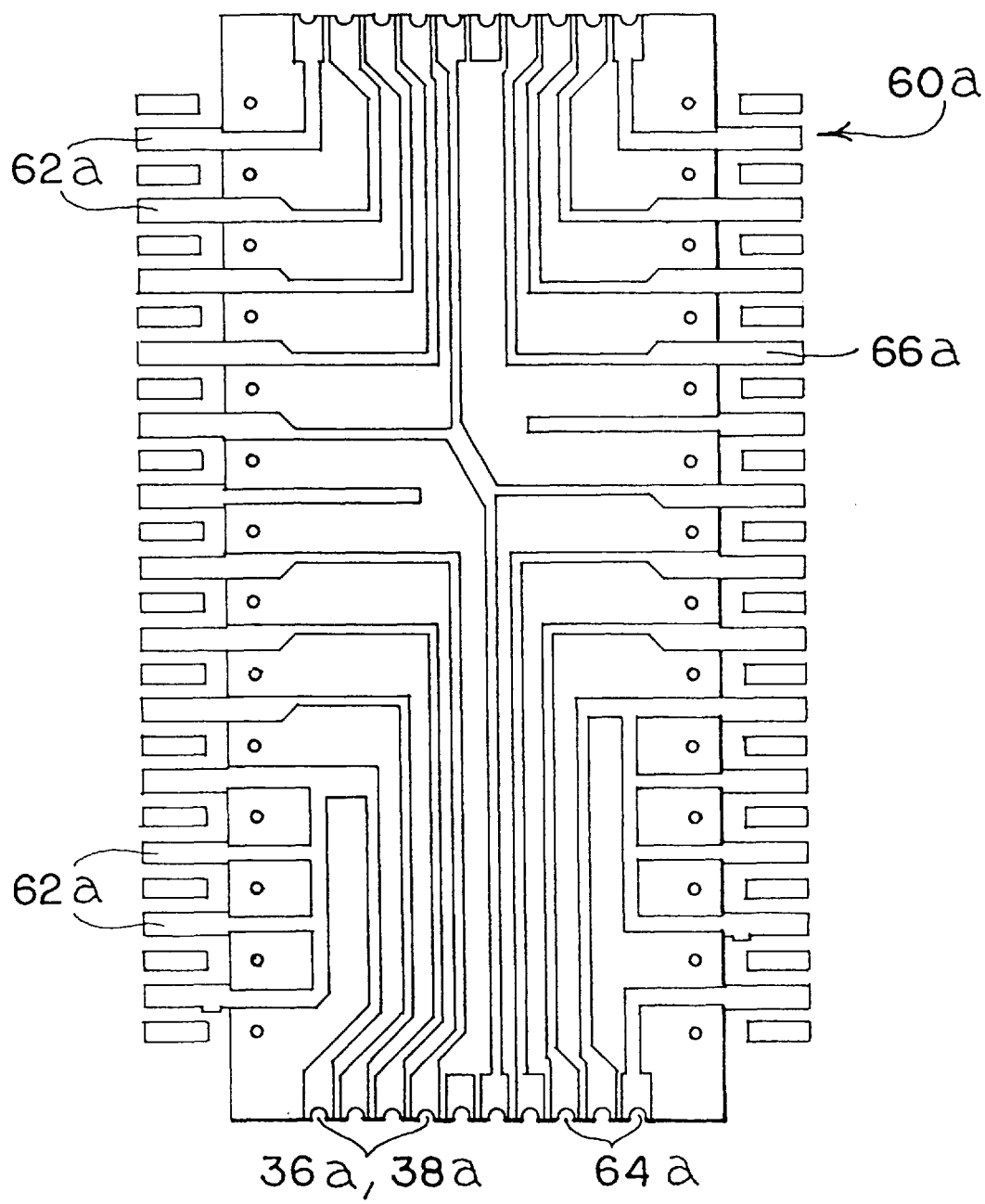
FIG. 14 illustrates the bottom of the ceramic integrated circuit package of FIG. 1 showing a lead frame attached thereto in schematic plan view.

Referring to FIGS. 7 and 8, castellations 36, 38 and 40 are small indentations which facilitate the attachment of an external lead frame 60a (FIG. 14) for electrically connecting the integrated circuit die 22 to the external electronic system. Castellations 36 and 38 are metalized as illustrated in FIG. 8. Castellation 40 is not metalized. The selective metalization of castellations 36 and 38 allows more uniform control of lead frame connections to bond pads 28 during flow soldering operations. FIG. 9 illustrates ceramic seal ring layer 34 and the preformed metalized seal ring 42 attached thereto.

Figure 11:
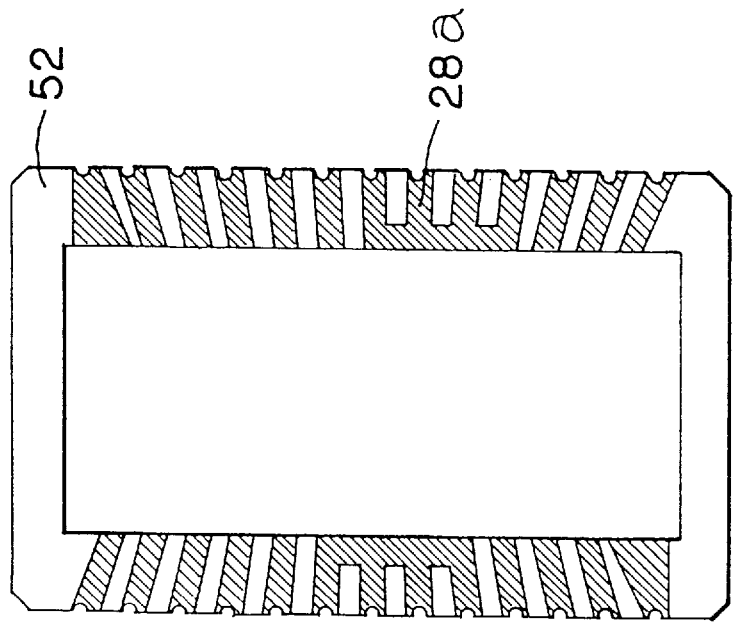
FIG. 11 illustrates in schematic top view the wire bond pad layer of the ceramic integrated circuit package assembly of FIG. 10.
Figure 10:
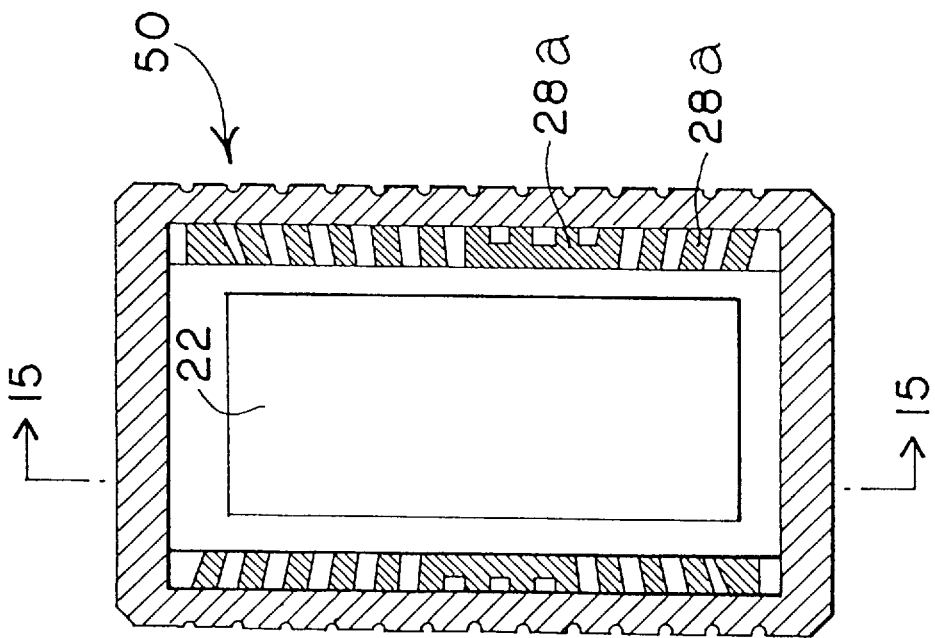
FIG. 10 illustrates another embodiment of the ceramic integrated circuit package of the present invention in schematic top view.

Another embodiment of the present invention is illustrated in FIG. 10. An integrated circuit ceramic housing assembly 50 has bond pads 28a parallel with the long axis of die 22. This arrangement of bond pads 28a may allow more connections to the die 22 contained within housing 50. FIG. 11 illustrates a ceramic wire bond pad layer 52 representative of that used in fabrication of housing 50.

Figure 12:
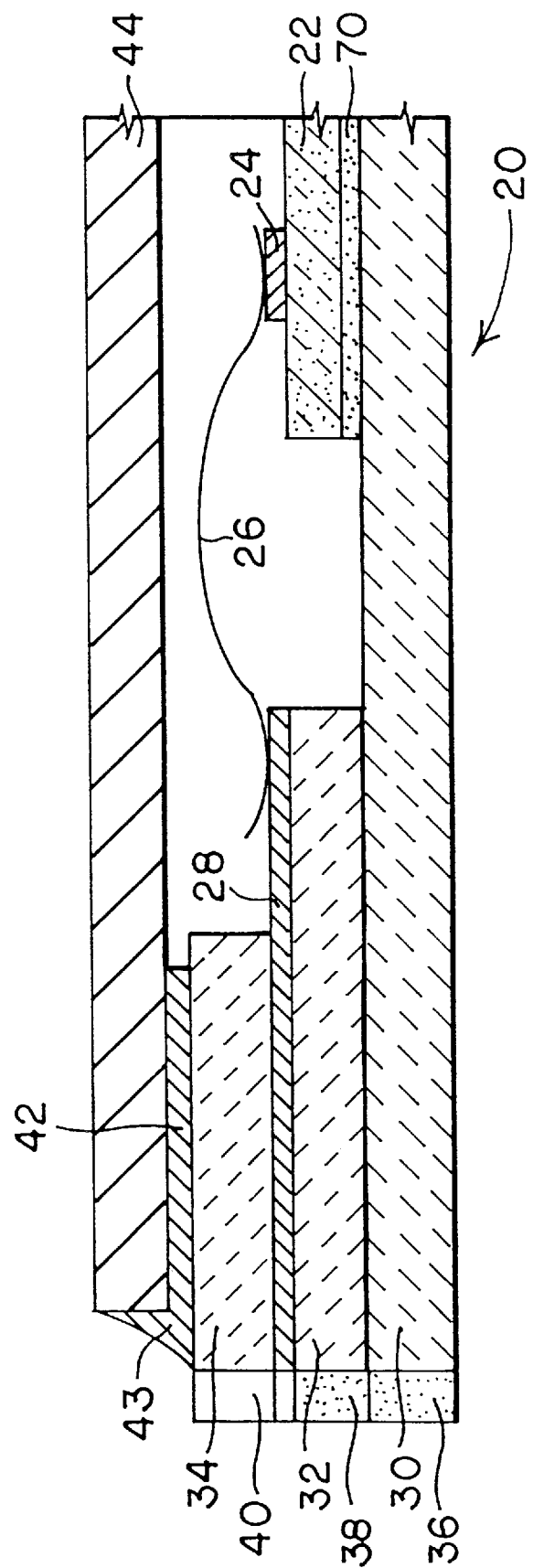
FIG. 12 illustrates section 12—12 of FIG. 1 in schematic elevational view.
Figure 13:
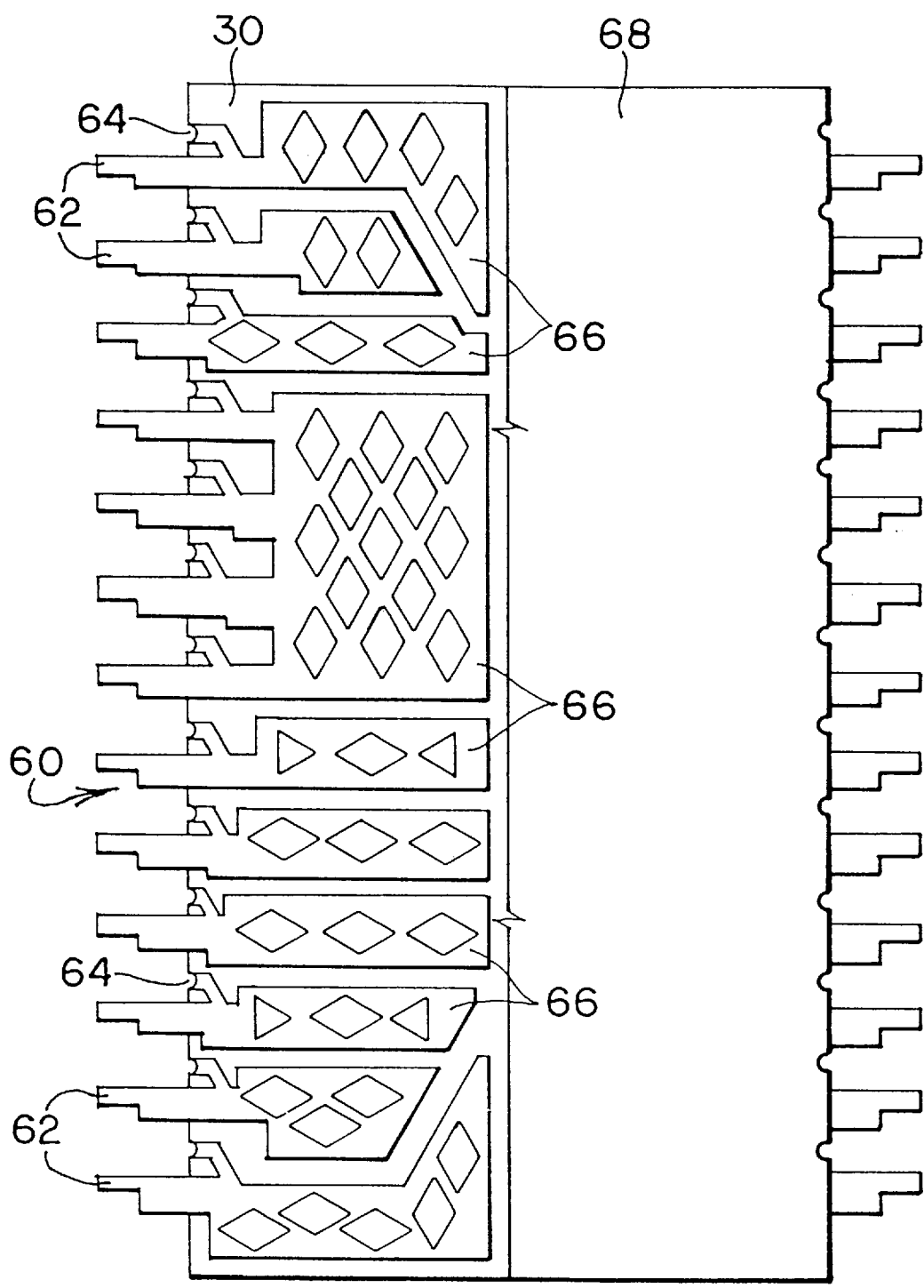
FIG. 13 illustrates the bottom of the ceramic integrated circuit package of FIG. 10 showing a lead frame attached thereto in schematic plan view.

FIG. 12 illustrates a cross-section 12—12 of FIG. 1 in schematic elevational view. Layers 30, 32 and 34 are illustrated. Die connection pads 24 are connected to housing wire bond pads 28 by means of bond wires 26. Bond pads 28 are continuous through bond pad layer 32 so bond pads 28 may connect with the external metalized castellations 38 which ultimately are connected to an external lead frame 60 (FIG. 13).

Figure 12A:
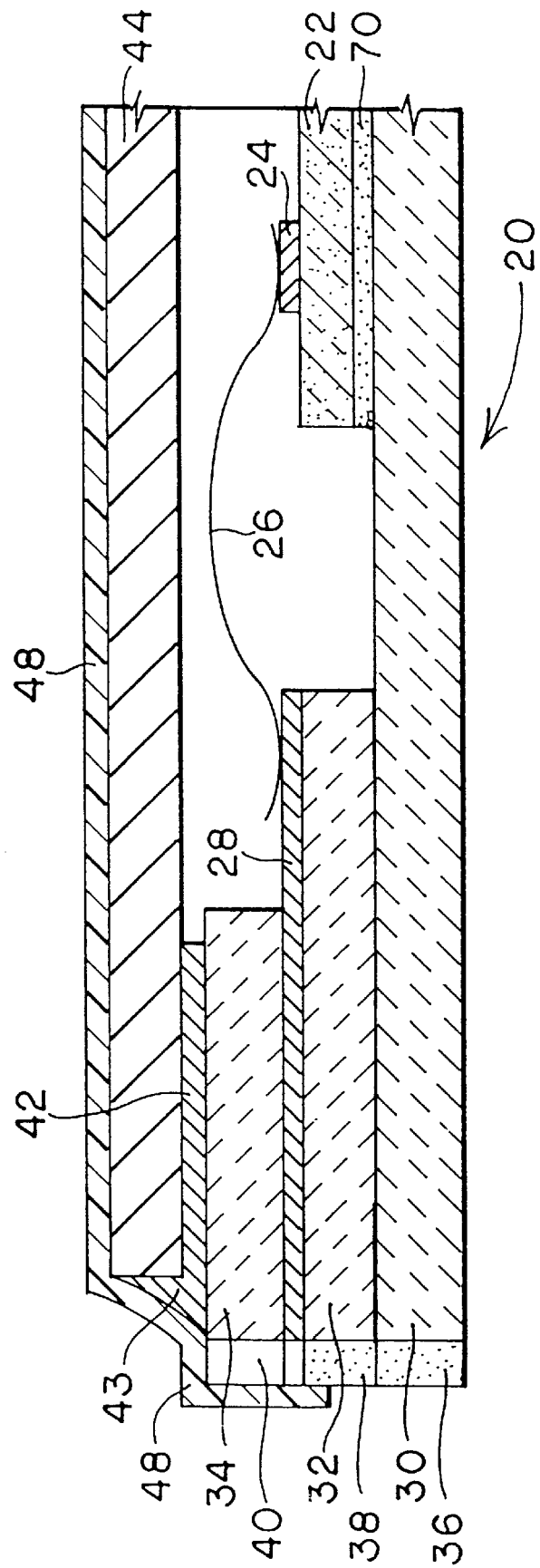
FIG. 12a illustrates a polymer insulating layer over the top of the ceramic package of the present invention in schematic elevational view.

FIG. 12a illustrates a cross-section of 12—12 of FIG. 1 having a polymer cap or tent 48 over lid 44, preformed metalized solder seal ring 42 and the edge of ceramic seal ring layer 34. Tent 48 is used to insulate lid 44 from contact with an exposed lead frame of another ceramic package when stacking ceramic packages together, one on top of another. Tent 48 also covers solder seal ring 42 and fillet 43. Tent 48 provides a solder mask to prevent solder from coming into contact with seal ring 42 and fillet 43 during subsequent solder dipping operations.

Die 22 may be attached to base 30 with thermally conductive adhesive 70 which may be, for example, silver-loaded glass manufactured by Johnson-Matthey. Thermally conductive adhesive 70 may be used to attach die 22 to base 30 by firing the assembly comprising die 22, thermally conductive adhesive 70 and base 30, where the glass melts and fuses die 22 to base 30.

Housing 20 may be hermetically sealed to lid 44 by placing the housing 20 and lid 44 assembly in a nitrogen filled oven, wherein a preformed metalized solder seal ring 42 with preformed metalization reflows. After lowering the oven temperature, the solder forms an air-tight hermetic seal between housing 20 and lid 44. A solder fillet 43 (FIG. 12) forms on the outside of the interface between lid 44 and ceramic seal ring layer 34. Alternately, the seal may be made by seam or laser welding, or by a glass seal in conjunction with a ceramic lid. These alternative sealing methods are preferred where the internal materials are particularly heat sensitive since they provide localized heat to the sealing ring and reduce the maximum temperature exposure of internal components during manufacture.

After housing 20 is hermetically sealed to lid 44, external lead frame 60 is attached to the bottom exterior face of the ceramic base layer 30 as illustrated in FIG. 13. External lead frame 60 includes lead frame connection pins 62, lead frame castellation connections 64 and lead frame heat transfer members 66. Castellation connections 64 connect to bond pad and base layer castellations 38 and 36, respectively. Pins 62 connect to the electronic system circuits. Heat transfer members 66 are used to efficiently transfer heat flowing through the thin base layer 30 from the integrated circuit die 22. Base layer 30 has sufficiently large surface area to rapidly transfer heat from integrated circuit die 22 into heat transfer members 66 where the heat is transmitted by pins 62 into the electronic system for ultimate heat removal. Having heat transfer members 66 in close proximity and communication with most of the surface area of base 30 aids in the rapid removal of heat from the integrated circuit package of the present invention.

Insulation 68, which is preferably a polymer, is utilized to prevent external lead frame 60 from shorting to conductive elements or materials on the top of an adjacent integrated circuit package if two or more packages are stacked vertically. FIG. 13 illustrates how insulation 68 has been cut partially away, exposing external lead frame 60.

Figure 15:
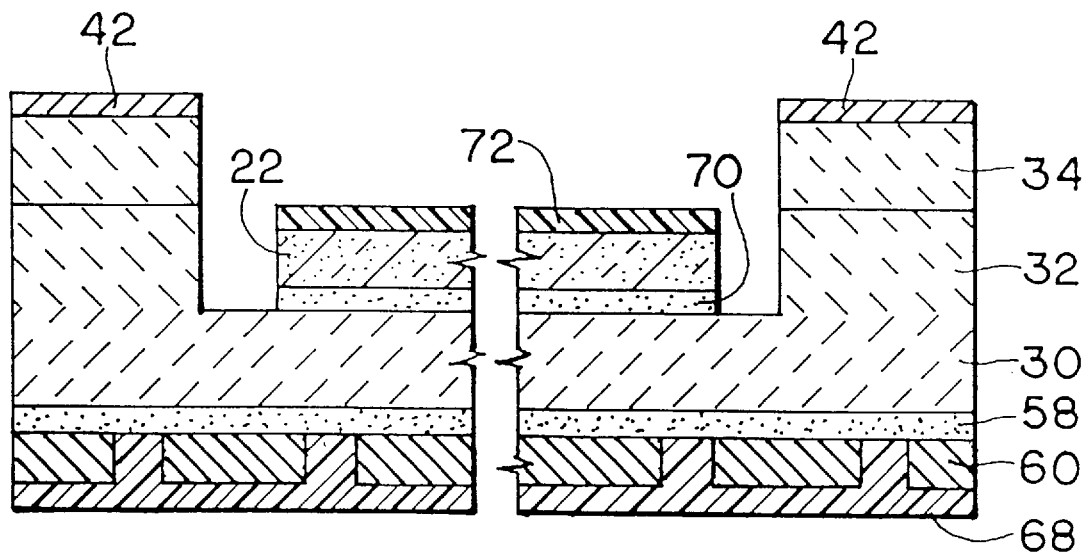
FIG. 15 illustrates section 15—15 of FIG. 10 in schematic elevational view.
Figure 16:
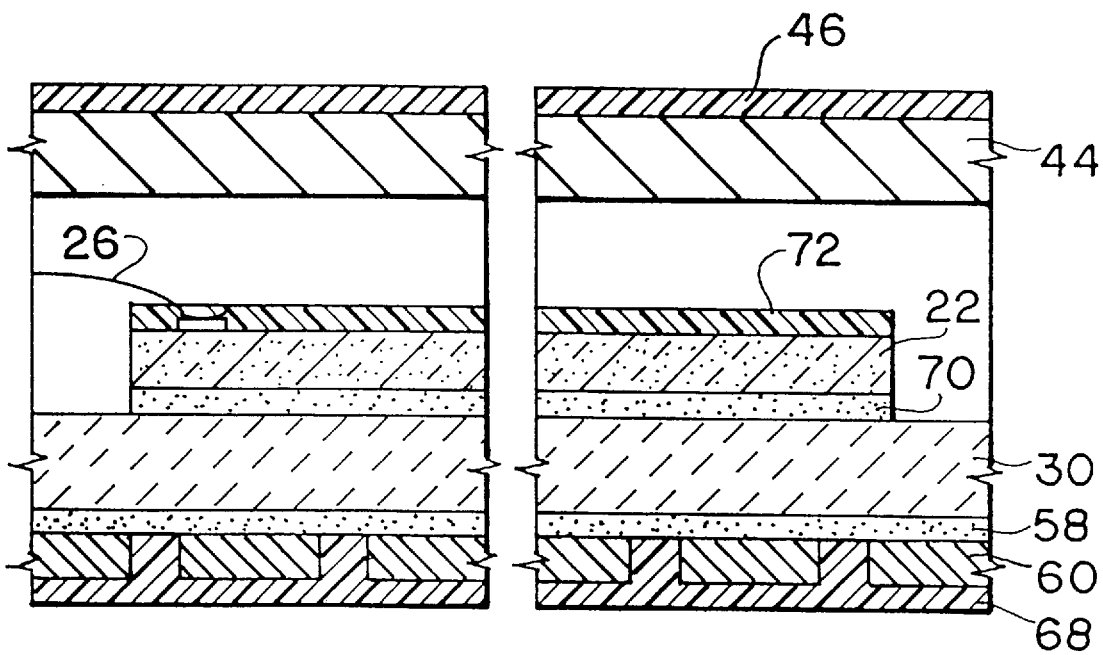
FIG. 16 illustrates a partial cross section of the present invention in schematic elevation view.

FIG. 15 is a schematic cross-section elevational view of FIG. 10 which illustrates ceramic layers 30, 32 and 34, die 22, thermally conductive adhesive 70, polymer shield 72, external lead frame 60 and lead frame insulator and light shield 68. FIG. 16 is a schematic elevation view of a cross-section of the present invention illustrating, from top to bottom, lid 44 having polymer layer 46, polymer alpha particle shield 72 covering integrated circuit die 22 which is electrically connected to bond pad layer 32 by means of bond wires 26 and mechanically attached to ceramic base 30 by means of thermally conductive adhesive 70. External lead frame 60 is laminated to the exterior face of base 30 by means of lead frame adhesive 58. External lead frame 60 is protected from electrical shorting by insulation 68 which may also serve as a light (photon) shield.

Figure 17:
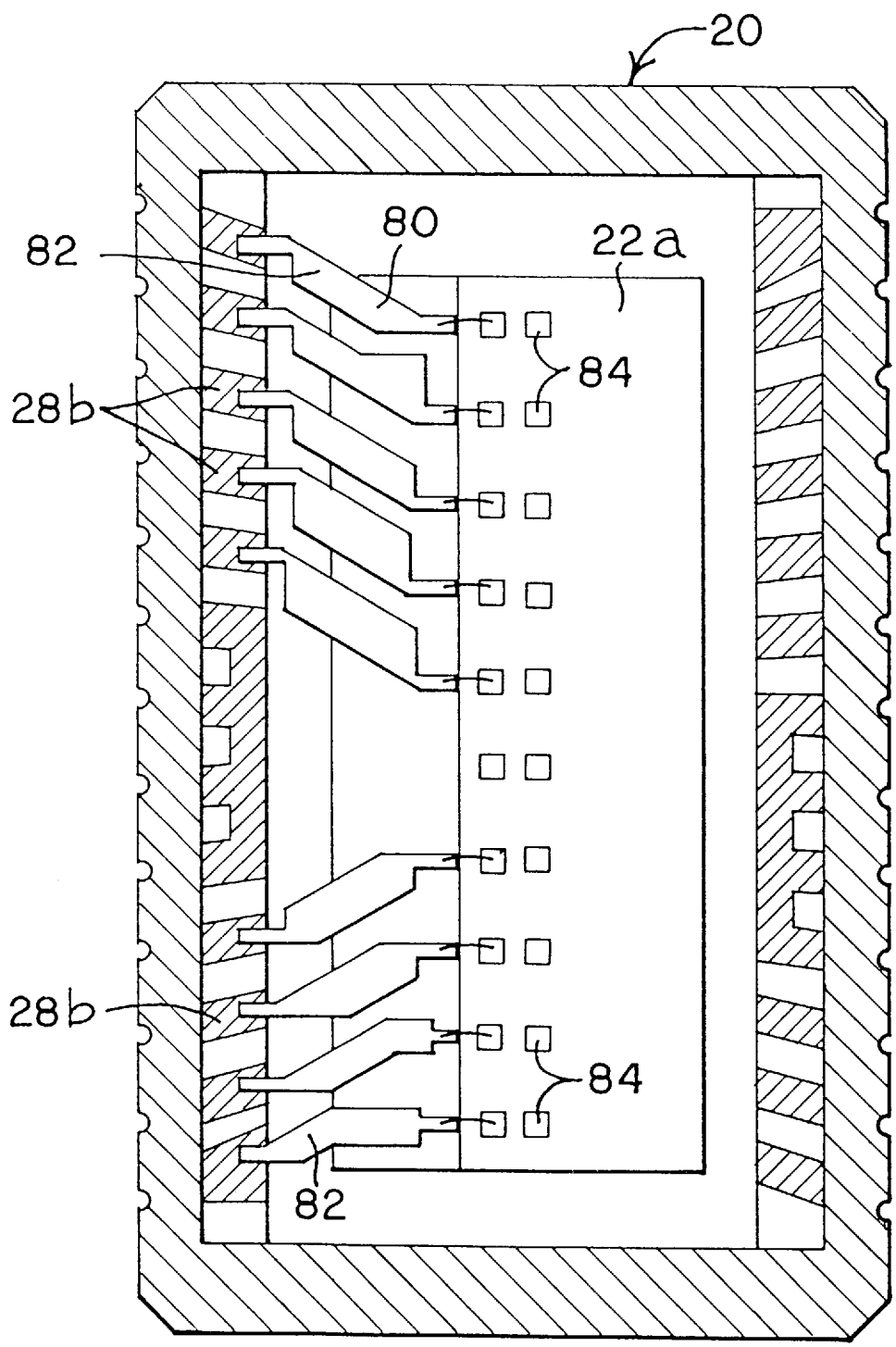
FIG. 17 illustrates a ceramic integrated circuit package of the present invention in schematic top view and having the top cover removed so that the lead-on-chip integrated circuit contained therein is exposed.
Figure 18A:
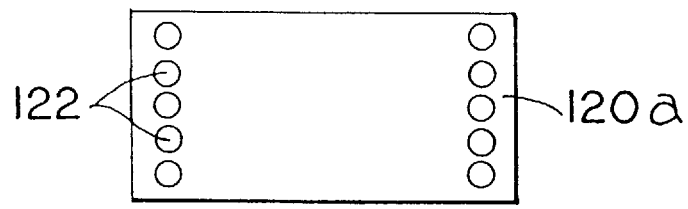
FIG. 18 illustrates embodiments of metal ground planes in schematic top view.
Figure 18B:
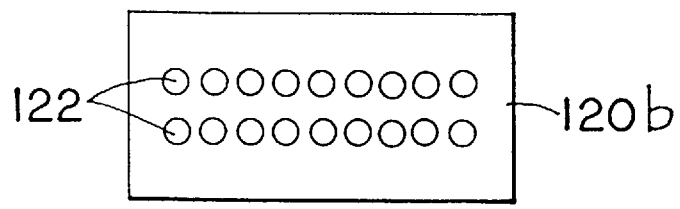
Figure 18C:
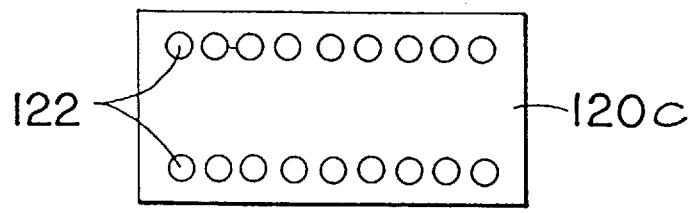
Figure 19A:
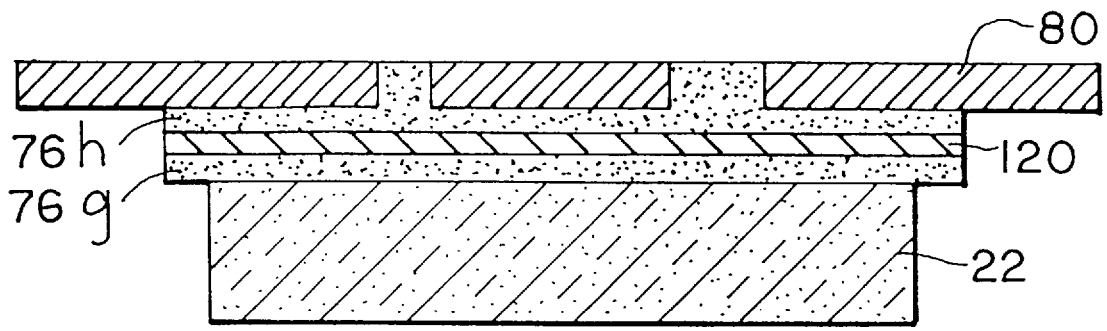
FIGS. 19a, 19b and 19c illustrates preferred embodiments of the present invention in schematic elevational views.
Figure 19B:
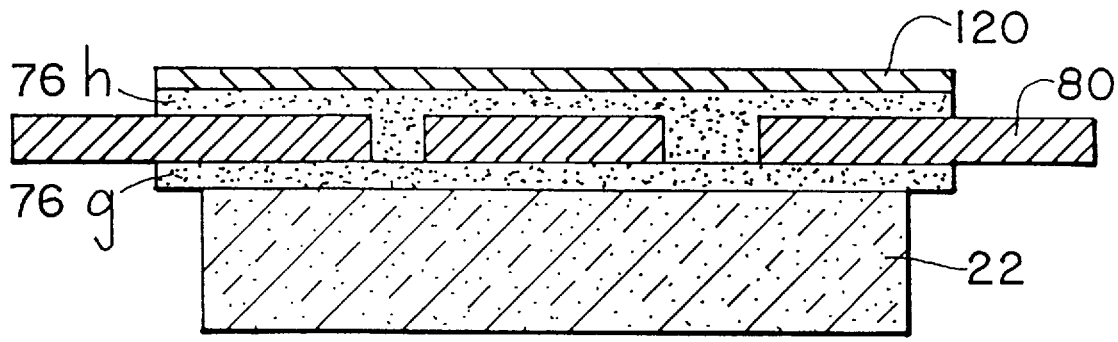
Figure 19C:
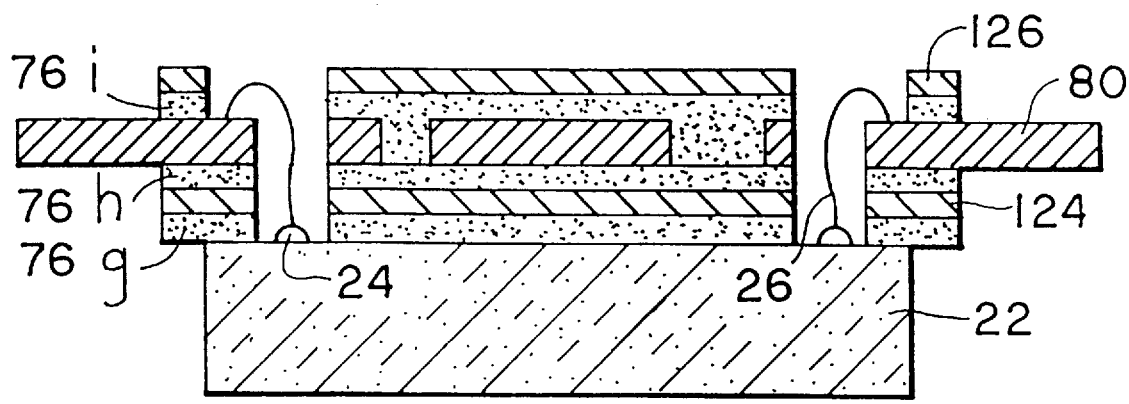

Referring now to FIG. 17, an integrated circuit die 22a having an internal lead frame 80 laminated thereto in a lead-on-chip configuration is mounted within housing 20. Internal lead frame 80 electrical conductors 82 attach to bond pads 28b. Integrated circuit die 22a may be of any size or electrical connection configuration because internal lead frame 80 may be adapted to connect die 22a bond pads 84 to housing 20 bond pads 28b. By so doing, physical design of packaging components may be standardized without regard to the type of integrated circuit die 22a used, or to any variance from one manufacturer to another.

Referring now to FIGS. 18, 19a, 19b and 19c, a unique aspect of the present invention is a heat spreading metal ground plane 120 situated either between the upper face of IC die 22 and internal lead frame 80, or above internal lead frame 80. In another embodiment, two ground planes, 124 and 126, are disposed in the package. Ground plane 124 is situated between die 22 and internal lead frame 80. Ground plane 126 is situated within the package above internal lead frame 80. This configuration sandwiches internal lead frame 80 between ground planes 124 and 126. By electrically connecting any or all of the metal ground planes to appropriate electrical connections (not illustrated) within the electronic system, electrical noise may also be greatly reduced.

Selection of internal lead frame 80 conductor dimensions and spacing between metal ground plane 120 affords a controlled impedance of the lead frame conductors for improved high frequency operation of the IC devices. Metal ground plane 120 and internal lead frame 80 may form either a stripline or microstrip system when using one or two ground planes, respectively. Design of stripline and microstrip systems are well known in the radio frequency electronics art. The spacing between the ground planes internal lead frame 80 may be controlled by the thickness of adhesive 76, which is used to attach the ground planes to die 22.

Use of the ground planes to reduce IC circuit noise and/or control signal impedances allows improvements in the operating speeds of ICs such as static random access memory (SRAM) and dynamic random access memory (DRAM) devices. Ground induced noise is also reduced by use of at least one ground plane.

Ground plane 120 may be used to spread heat flow, it may also be used to reduce noise, or it may additionally be used in conjunction with internal lead frame 80 for constant impedance signal transmission lines. The ground plane 120 may connect only to selected leads of internal lead frame 80, or ground plane 120 may extend beyond die 22 for connection to a heat dissipation system, noise grounding system and/or constant impedance signal transmission system (not illustrated).

Figure 20:
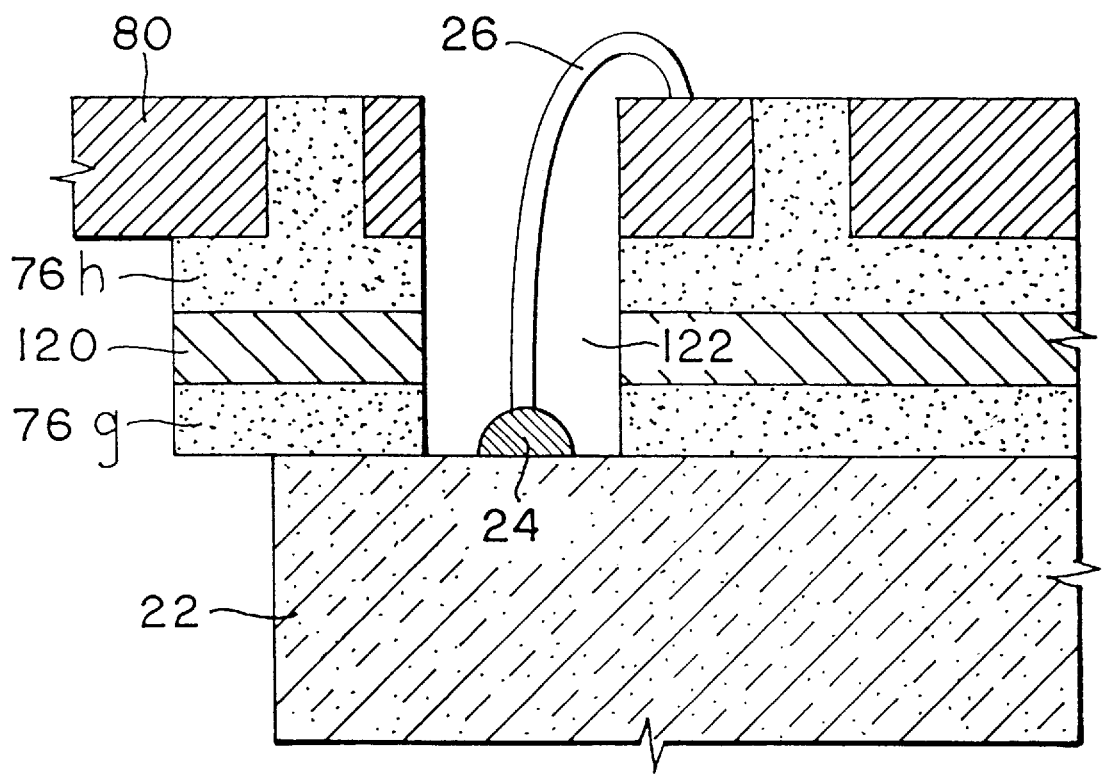
FIG. 20 illustrates a preferred embodiment of the present invention in a partial schematic elevational view.

Referring to FIG. 20, apertures 122 in metal ground plane 120 may be placed to easily facilitate interconnection of internal lead frame 80 to the IC connection pads 24, for example, by means of bond wires 26. Different patterns of apertures 122 (FIG. 18) may be used for die connection pads 24 on the perimeter, or within the interior plane, of the die face. Ground plane 120 may be connected to selected conductors of internal lead frame 80 or to external connections independent of internal lead frame 80 (not illustrated). Multiple electrical or thermal mechanical connections to ground plan 120 will improve the effective noise reduction and heat dissipation properties of the IC package 112, respectively.

Figure 21:
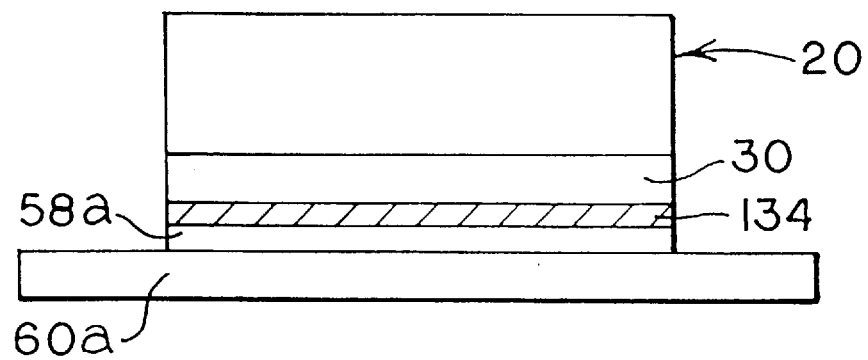
FIG. 21 illustrates a preferred embodiment of the present invention in schematic elevational view.

Referring now to FIG. 21, a thin metal layer 134, for example, copper or metalized ceramic, on the bottom surface of base layer 30 of ceramic housing 20 is illustrated. Metal layer 134 may be used as a ground plane for lead frame 60a and may be used to increase the heat spreading thermal conductivity of ceramic package 20. Metal layer 134 may be, for example, a one mil copper layer attached to the bottom surface of base layer 30 with about a 0.3 mil adhesive layer 59. Lead frame 60a is attached to metal layer 134 by adhesive 58a. Metal layer 134 may be adapted for connection to a heat dissipation system, noise grounding system and/or constant impedance signal transmission system (not illustrated).

Figure 22:
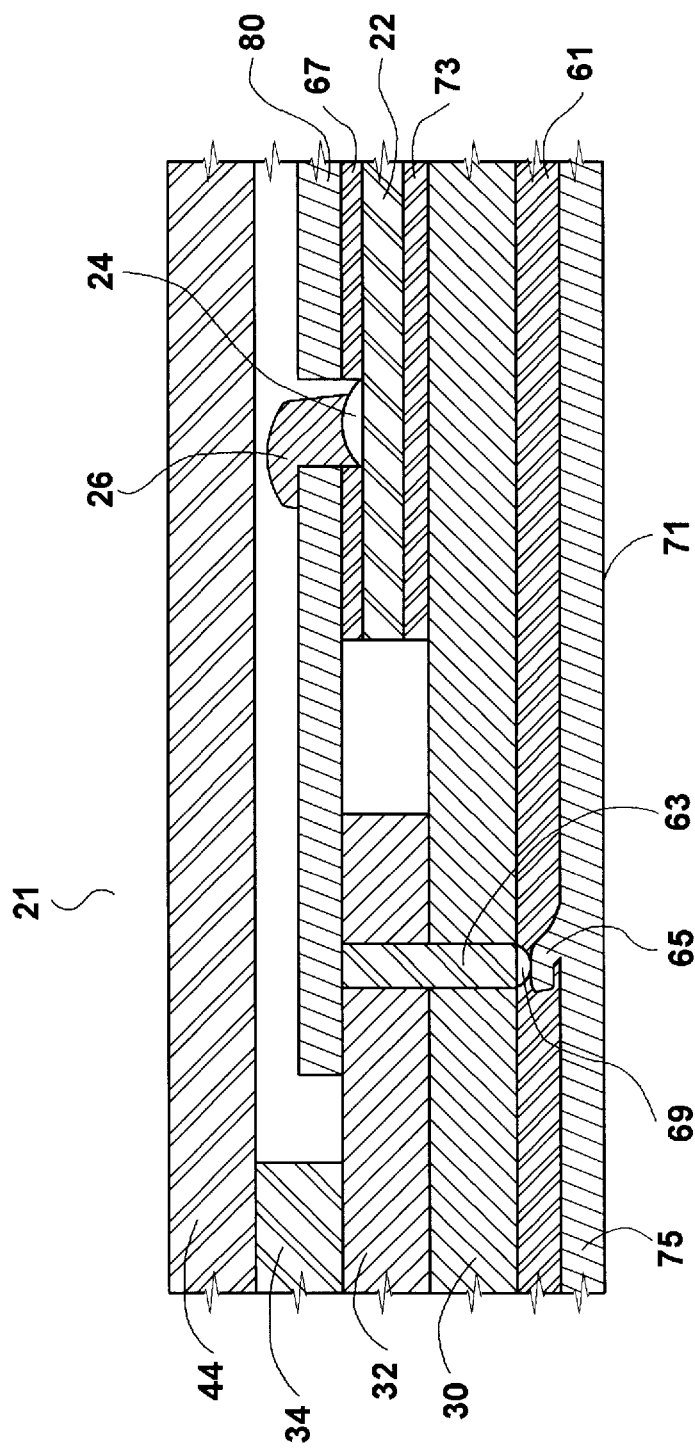
FIG. 22 illustrates an embodiment of the present invention including a lead-frame-on-chip and lead-frame-on-package configuration.
Figure 23:
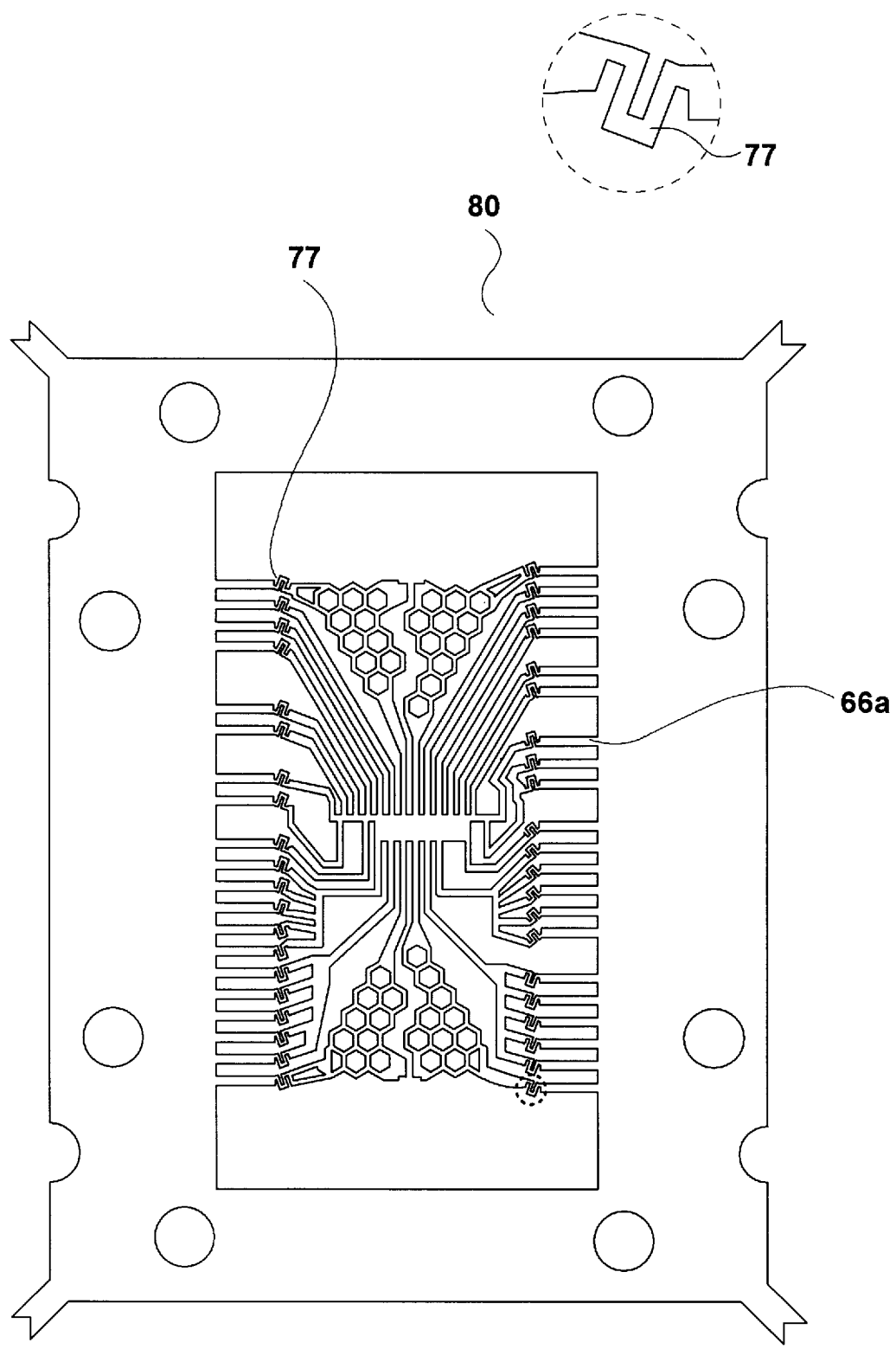
FIG. 23 illustrates an embodiment of an internal lead frame of the present invention.

In another embodiment, integrated circuit package 21, illustrated in FIG. 22, includes internal lead frame 80, which includes a plurality of substantially planar electrical conductors 66a (FIG. 23) which may be configured as heat transfer members 66 (FIG. 13) and which may be supported or unsupported. Internal lead frame 80 is preferably flexible and made of full hard copper alloy 110 formed, or etched to, 3 mils in thickness. Electrical conductors 66a on internal lead frame 80 are etched to about 6 mils in width. As illustrated in FIG. 23, electrical conductors 66a are etched thin and flexed in a "S" shaped layout, or squiggle, 77 prior to being bonded to an electrical connection portion, or a wire bond pad layer, 32 (FIG. 22) so conductors 66a are not in tension which allows for flexing of lead frame conductors 66a during temperature cycling conditions. Electrical conductors 66a are formed of sufficient length to provide for expansion or contraction of the elements of said individual packages 21 without inducing tension in conductors 66a or the connection points between conductors 66a and integrated circuit connection pads 24 or vias 63. The outlined portion of FIG. 23 illustrates the shape of internal lead frame 80 after it is punched out and separated from internal lead frame support portion 79, prior to being attached to die 22, described below.

Referring to FIG. 22, internal lead frame 80 is laminated to at least a substantial portion of the upper major surface of die 22 with a high temperature electrically insulating adhesive layer 67 in a lead-on-chip configuration. Adhesive layer 67 is a high temperature adhesive, such as a 2.5–3.0 mil layer of OxySIM Loc Adhesive Film 2421, Type 7201-71S, a polyimidesiloxane free based adhesive film from Occidental Chemical Corporation, which is effective for temperatures up to 443° C. A high temperature adhesive is used so seam sealing the integrated circuit package 21 is unnecessary. Alternatively, a tri-level high temperature adhesive tape, OxySIM Loc Adhesive Film 2421, Type 7201-71T, from Occidental Chemical Corporation, is used to attach internal lead frame 80 to die 22.

The lower major surface of die 22 is adhesively attached to the upper surface of ceramic base layer 30, on the interior of integrated circuit package 21, with an adhesive layer 73. Preferably, adhesive layer 73 is about 0.50–0.75 mils thick and is comprised of Johnson Matthey JM-7000 brand medium temperature adhesive, a silver-filled polycyanide ester. Alternatively, OxySIM Loc Adhesive Film 2420-A2 or 2421-A2, a silver-filled polyimidesiloxane adhesive film from Occidental Chemical Corporation, can be used.

Connection pads 24 on die 22 are electrically connected to electrical conductors 66a (FIG. 14) of internal lead frame 80 (FIG. 22) by bond wires 26. Aluminum wire is utilized for bond wires 26 which are wedge bonded to connection pads 24 and to conductors 66a. This is preferred in high temperature applications. Electrical conductors 66a may also be connected to die connection pads 24 by thermal compression bonding. Each conductor 66a of internal lead frame 80 is aligned with an electrically conductive conduit, or via 63, and is electrically connected by use of thermal compression bonding or ultrasound bonding techniques. Each via 63 forms an electrical signal path through package 21 from the upper surface of wire bond pad layer 32 to the lower exterior surface 75 of ceramic base layer 30. An external electrical contact, or bump 69, typically made of gold, is formed at the junction of each via 63 and the lower exterior surface 75 of ceramic base layer 30.

Figure 24:
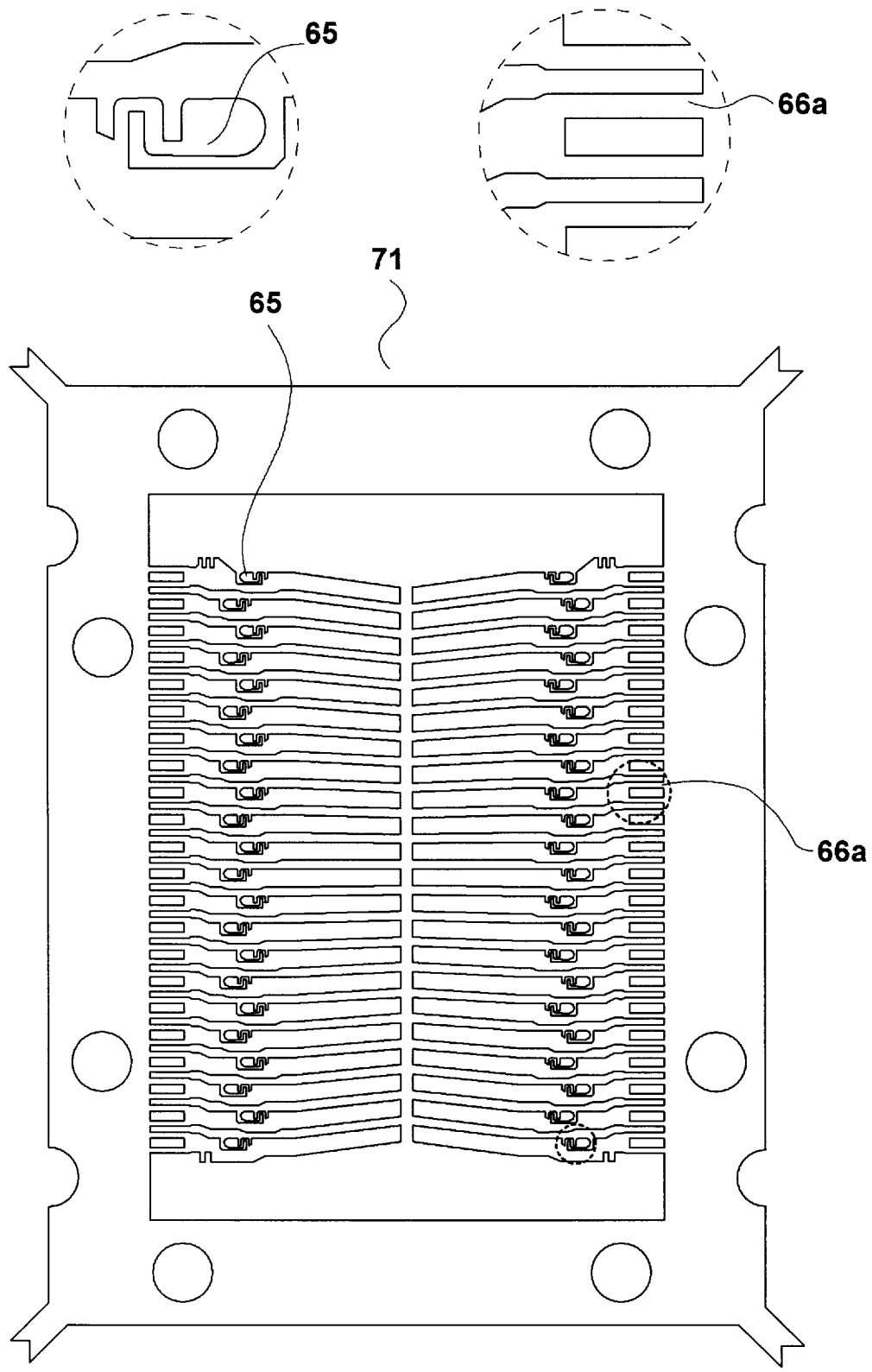
FIG. 24 illustrates an embodiment of an external lead frame of the present invention.

External lead frame 71, illustrated in FIG. 24, is preferably about 3 mils thick, includes conductors 66a etched to about 6 mils in width, and may be supported or unsupported. As shown in FIG. 22, conductors 66a on external lead frame 71 are selectively connected, via lead connection tips 65, to certain contacts 69 by thermal compression bonding lead tips 65 to contacts 69 so only preselected signal paths are created between die 22 and external lead frame 71. An adhesive insulating layer 61, which may be a double-sided adhesive polyimide tape, or Rogers adhesive, attaches external lead frame 71 to the bottom surface of ceramic base layer 30, on the exterior of integrated circuit package 21 in a lead-on-package configuration. Apertures 122 formed in insulating adhesive layer 61 correspond to contacts 69 which are to be selectively connected to lead tips 65 of external lead frame 71. The lead tips 65 are flexible so as to be able to maintain contact with contacts 69 during temperature cycling conditions. Each lead tip 65 is thermal compression bonded to a selected contact 69 through an aperture 122 in insulating adhesive layer 61.

To provide selective addressability, or connectivity, for individual packages 21 in a stacked module comprised of identical single packages, it is necessary to provide selective connections to die 22. In the preferred embodiment, selectivity is provided by modifying insulating adhesive layer 61 to expose only selected contacts 69 for connection to a standardized external lead frame 71. Selective connectivity could also be provided by using customized external lead frames 71 for each level in the module and filling the apertures 122 containing nonselected contacts 69. Where a standard internal lead frame 80 is to be used, contacts 69 which are not to be connected to external lead frame 71 are covered by insulating adhesive layer 61.

In another embodiment, external lead frame 71, made from copper alloy 195, is etched to match the desired pattern of contacts 69 for mechanical and electrical connection thereto. Lead connection tips 65 are then braised to selected contacts 69 to make electrical and mechanical connection only with those contacts 69 which are part of the preselected pattern of contacts 69 to be connected. After the lower housing portion including ceramic base layer 30, wire bond pad layer 32, internal lead frame 80, die 22 and ceramic seal ring layer 34 of ceramic package 21 is assembled, lid 44 is positioned and sealed on top of ceramic seal ring layer 34.

To customize electrical connection paths between each die 22 of each integrated circuit package 21 and external electrical devices when, for example and without limitation, such packages are configured in a stacked arrangement, selective electrical connections are formed by either: 1) connecting die connection pads 24 to preselected electrical conductors 66a (FIG. 14) of internal lead frame 80; or 2) by connecting lead connection tips 65 of external lead frame 71 to preselected contacts 69.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. A hermetically sealed ceramic integrated circuit package having good thermal conductivity for efficiently transferring heat from an integrated circuit die contained therein, comprising:

an integrated circuit die having a face with integrated circuit connection pads thereon;

a ceramic housing, comprising a base, electrical connection portion and a seal ring, said integrated circuit die being mounted within said ceramic housing, said electrical connection portion having a plurality of conductive vias formed therein;

an internal lead frame attached to and disposed over a substantial portion of said face of said integrated circuit die, selected elements of said internal lead frame being connected to selected ones of said integrated circuit die connection pads, and to selected ones of said conductive vias, each of said vias extending from said connection portion through said ceramic housing base and terminating at an electrical contact disposed on said exterior surface of said housing base;

a cover attached to said ceramic housing seal ring, said cover and housing being hermetically sealed together; and an external lead frame having a plurality of lead connection tips, said external lead frame being attached to an exterior surface of said ceramic housing base, said plurality of lead connection tips of said external lead frame being aligned with and electrically connected to selected ones of said electrical contacts disposed on said exterior surface of said ceramic housing base.

2. The package of claim 1, wherein said internal lead frame is attached to said face of said integrated circuit die with a high temperature adhesive.

3. The package of claim 1, wherein said external lead frame is comprised of copper alloy 195.

4. The package of claim 1, wherein said internal lead frame is attached to said face of said integrated circuit die with a polyimide tape having adhesive attached to both sides of said tape.

5. The package of claim 1, wherein said electrical contacts are made of gold.

6. The package of claim 1, wherein said external lead frame lead connection tips are flexible and are electrically connected to said selected electrical contacts by thermal compression bonding said lead connection tips to selected said electrical contacts.

7. The package of claim 1, wherein said internal lead frame is comprised of a plurality of substantially planar flexible electrical conductors.

8. The package of claim 1, wherein said internal lead frame electrical conductors are formed of sufficient length to provide for expansion or contraction of the elements of said packages without inducing tension in said conductors or the connection points between said conductors and said integrated circuit connection pads or said vias.

9. The package of claim 1, further comprising an electrically insulating layer disposed between said external surface of said ceramic housing base and said external lead frame, said insulating layer including apertures formed therein which correspond to selected ones of said electrical contacts disposed on said exterior surface of said ceramic housing base.

10. The package of claim 9, wherein said lead connection tips of said external lead frame are electrically connected to selected ones of said electrical contacts via said apertures formed in said insulating layer.

11. The package of claim 1, wherein said elements of said internal lead frame include an "S" shaped portion formed therein which allows for flexing of said lead frame elements during temperature cycling conditions.

* * * * *